(12) United States Patent
Gao et al.

(10) Patent No.: US 8,735,223 B2
(45) Date of Patent: May 27, 2014

(54) SEMICONDUCTOR DEVICES AND METHODS OF ASSEMBLING SAME

(75) Inventors: Wei Gao, Tianjin (CN); Zhiwei Gong, Chandler, AZ (US); Dehong Ye, Tianjin (CN); Huchang Zhang, Tianjin (CN)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/398,811

(22) Filed: Feb. 16, 2012

(65) Prior Publication Data

US 2013/0056861 A1 Mar. 7, 2013

(51) Int. Cl.
*H01L 29/66* (2006.01)

(52) U.S. Cl.
USPC ........... 438/122; 438/111; 438/112; 438/123; 257/E23.037; 257/E23.04; 257/E23.06

(58) Field of Classification Search
USPC ................... 257/666–677, E23.031–E23.059, 257/E23.037, E23.04, E23.06; 438/111, 438/112, 122, 123, FOR. 366, FOR. 377, 438/FOR. 380, FOR. 413

See application file for complete search history.

(56) References Cited

U.S. PATENT DOCUMENTS

| | | | |
|---|---|---|---|
| 5,696,666 A | 12/1997 | Miles | |
| 6,395,578 B1 | 5/2002 | Shin | |
| 6,396,130 B1 | 5/2002 | Crowley | |
| 6,818,968 B1 * | 11/2004 | Cheah | 257/666 |
| 6,900,535 B2 | 5/2005 | Zhou | |
| 6,917,097 B2 | 7/2005 | Chow | |
| 7,033,866 B2 | 4/2006 | Chow | |
| 7,554,180 B2 * | 6/2009 | McKerreghan et al. | 257/676 |
| 2007/0273023 A1 | 11/2007 | Zhao | |
| 2008/0083981 A1 | 4/2008 | Romig | |
| 2010/0072589 A1 * | 3/2010 | Camacho et al. | 257/676 |
| 2011/0133322 A1 * | 6/2011 | Lin et al. | 257/676 |
| 2012/0205790 A1 * | 8/2012 | Haga | 257/676 |

* cited by examiner

*Primary Examiner* — Jasmine Clark
(74) *Attorney, Agent, or Firm* — Charles Bergere (57) ABSTRACT

A method of forming a semiconductor device includes affixing a die to a heat sink to form a die and heat sink assembly and then placing the die and heat sink assembly on a support element. A semiconductor device includes a die and heat sink assembly disposed on a support element. The die and heat sink assembly is pre-assembled prior to being disposed on the support element.

15 Claims, 12 Drawing Sheets

SEMICONDUCTOR DEVICES AND METHODS OF ASSEMBLING SAME

BACKGROUND OF THE INVENTION

The present invention relates to semiconductor devices and methods of assembling semiconductor devices and, more particularly, to methods for improving heat dissipation of semiconductor devices.

Conventional techniques for forming semiconductor devices for high current and/or high-power applications typically involve mounting the power die onto a die pad, which functions as a heat sink to improve dissipation of heat generated by the power die. A die pad, typically formed of metallic material, of a relatively high thickness is required.

Currently, there are two principal techniques to achieve this increased-thickness heat sink, either using a lead frame of increased thickness or using a dual-gauge lead frame. Implementing either technique makes the lead frame significantly more expensive than would otherwise be necessary, thereby making the overall cost of the packaging process undesirably high. The increased thickness also introduces its own limitations into lead frame design and manufacturing as well as for the package layout. For instance, the lead pitch is related to the lead frame thickness requiring a certain etching or stamping aspect ratio.

Use of a dual-gauge lead frame, requires the lead frame to have two or more portions of differing thicknesses. Some techniques require the two lead frame portions be attached to one another, where the portion having the higher thickness functions as a heat sink. This is a relatively complicated arrangement, requiring relatively complex manufacturing processes, also leading to higher cost and presenting some design limitations.

For semiconductor products such as PQFN (Power Quad Flat No Lead) products, the step(s) required for attaching the die in the semiconductor device must be done prior to taping the lead frame in order to avoid damage of the tape in subsequent process steps, such as the curing and/or re-flow processes. Taping the lead frame with the die attached can lead to handling difficulties. For instance, where a die is disposed on a lead frame, the die has to be protected from damage or scratching during the lead frame taping process. Also it may not be possible to design and use a universal tool/jig in the taping machine because each process will likely require a different layout on the lead frame. That means a higher tooling cost and increased difficulty in tooling conversion when products change. Further, the strip warpage of a lead frame with a die is greater than a lead frame without a die, thus leading to higher probability of incidences of lead frame jamming in the taping machine.

Thus, it would be advantageous to develop one or more new manufacturing techniques to lower lead frame cost, particularly in high-power applications, and eliminate the aforementioned handling issues and design limitations. Additionally, it would be advantageous if these one or more new manufacturing techniques could allow more flexibility for mixing and matching of components from techniques normally considered incompatible, or at least difficult to integrate, for semiconductor packaging. It also would be advantageous if these one or more new manufacturing techniques maintained or improved upon currently available performance for heat dissipation.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION OF THE INVENTION

In one embodiment, the present invention provides a method of forming a semiconductor device, the method comprising affixing a die to a heat sink to form a die and heat sink assembly; and disposing the die and heat sink assembly on a support element of the semiconductor device.

In another embodiment, the present invention provides a method of forming a semiconductor device, the method comprising affixing a die to a die pad to form a die and die pad assembly; and disposing the die and die pad assembly on a support element of the semiconductor device.

In yet another embodiment, the present invention provides a semiconductor device comprising a die and heat sink assembly disposed on a support element of the semiconductor device, the die and heat sink having been pre-assembled prior to being disposed on the support element.

Implementation of embodiments of the invention may provide significant technical benefits in comparison to conventional techniques. For instance, pre-assembly of the die and heat sink assembly prior to being disposed on the support element of the semiconductor device streamlines the device assembly process, reducing difficulties in handling issues. For instance, it is necessary to perform only one placing operation on to the support element for the die and heat sink assembly, rather than having to perform two (or more) placing operations, one or more for each of the heat sink and the die. This is a particularly advantageous feature when implementing Pick & Place techniques.

Additionally, the cost of the base component of the semiconductor device, whether being a lead frame or a substrate, as will be discussed in further detail below, may be significantly reduced by reducing its thickness. The required thickness for the heat dissipation may otherwise be provided with a heat sink having a thickness greater than a thickness of the base component, without the attendant additional expense and design limitations from having a base component of increased thickness, or a dual-gauge base component, such as a dual-gauge lead frame.

Further, die attachment to the heat sink/die pad may be realized without a lead frame form. In conventional semiconductor packaging processes, the die is usually attached on a lead frame or a substrate. In embodiments of the invention, the die can be attached on a single die pad/heat sink to form a die and die pad/heat sink assembly before packaging. This allows for increased flexibility and greater simplicity in packaging processes requiring a thicker die pad and/or heat sink. For instance, the heat sink material could be different than the material of the base component, having better thermal properties to achieve better product performance. In addition, the heat sink thickness and shape is no longer limited by basic component manufacturing techniques. Another advantage of using the pre-assembled die and die pad or heat sink assembly is to allow use of high temperature die attach materials of improved thermal properties, e.g., solder or high temperature cured epoxy. In this regard, pre-assembly of the die and die pad or heat sink assembly may be particularly advantageous when using solder as this provides improved heat dissipation when compared to other die-attach materials.

Yet further, the invention eliminates the handling issue noted above of taping the lead frame with mounted devices.

The invention has application in numerous semiconductor packaging techniques where a heat sink is required. For instance, in embodiments of the present invention, the pre-assembled die and heat sink assembly can be disposed on a normal die pad, which acts as the support element of the semiconductor device. Additionally, a pre-assembled die and heat sink assembly can also be used in semiconductor packages where the assembly is disposed upon a standard lead frame.

As noted, the invention has broad application across multiple semiconductor packaging technologies. For instance, the invention has application in BGA/LGA manufacturing techniques, such as MAP BGA/LGA techniques. Additionally, the invention has application in lead frame manufacturing, implementing, say, QFN, PQFN, QFP, SOIC, etc. techniques.

In addition, embodiments of the invention can be implemented using standard or semi-standard semiconductor manufacturing machinery as the process steps involved are identical, or at least very similar, to numerous standard processes, such as QFN/PQFN processes. Additionally, the die pad carrier, which is a carrier for placing individual die pads, could be similar to the substrate carrier in standard flip chip processes. Other techniques could use a die pad/heat sink assembly also, for instance, to allow attachment of multiple dies to a large piece of metal prior to separation with a singulation tool. Further, normal die bond tools and/or pick and place tools can be used for placement of the die and heat sink assembly. A further benefit for some manufacturers is that provision of the heat sink, with or without the die pre-assembled, is well within the manufacturing capabilities of numerous lead frame suppliers, thereby offering potential cost savings from implementation of the low-cost stamping technologies. Similar benefits may also be realized when the invention is implemented in, say, a BGA context.

Also disclosed is a method of assembling a semiconductor device, the method comprising: providing a base component (such as a substrate or a lead frame) having an opening therethrough; affixing a tape to an underside of the base component, the tape covering the opening through the base component; disposing or placing a heat sink on the tape, a first major surface of the heat sink being in contact with the tape, the heat sink resting in the opening; and affixing a die to a second major surface of the heat sink. Additionally, other elements could be placed onto the tape also to broaden functionality of the semiconductor device, for instance, additional metal leads, SMD (Surface Mount Device) and the like.

In one implementation of this method, the first major surface of the heat sink is coplanar with the underside of the base component, such as a substrate.

The terms "a" or "an," as used herein, are defined as one or more than one. Also, where included, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second", where used, are used to distinguish between the elements such terms describe. Thus, these terms are not necessarily intended to indicate temporal or other prioritization of such elements.

Because the apparatus implementing the present invention is, for the most part, composed of device components known to those skilled in the art, full details will not be explained in any greater extent than that considered necessary for the understanding and appreciation of the underlying concepts of the present invention and in order not to obfuscate or distract from the teachings of the present invention.

Some of the embodiments may be implemented using a variety of different base components. For example, although FIG. 1 and the discussion thereof describes use of a lead frame as the base component in the semiconductor device, this exemplary semiconductor device is presented merely to provide a useful reference in discussing various aspects of the invention. As will be noted, alternative base components may be used in embodiments of the invention, such as a substrate as illustrated in FIG. 2, or other suitable base components. Of course, the description of the embodiments of the invention has been simplified for purposes of discussion, and it is just one of many different types of appropriate embodiments that may be used in accordance with the invention. Those skilled in the art will recognize that the embodiments are merely illustrative and that alternative embodiments may utilize different base components or use alternate heat sink components.

Further, those skilled in the art will recognize that the embodiments are merely illustrative. Moreover, alternative embodiments may include multiple instances of a particular operation, and the order of operations may be altered in various other embodiments.

Figure 1A:
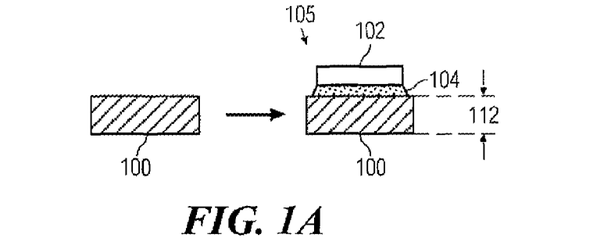
FIG. 1A is an elevational view illustrating the formation of a die and heat sink assembly in accordance with an embodiment of the present invention.

Referring now to FIG. 1, this illustrates an embodiment of the invention in a PQFN context. Illustrated first in FIG. 1A is a stand-alone heat sink 100 on which a die 102 is affixed using, for example, solder or thermally-conductive epoxy or film 104. In doing so, a die and heat sink assembly, that is, a pre-assembled die and heat sink, generally referred to by 105, is formed.

Figure 1B:
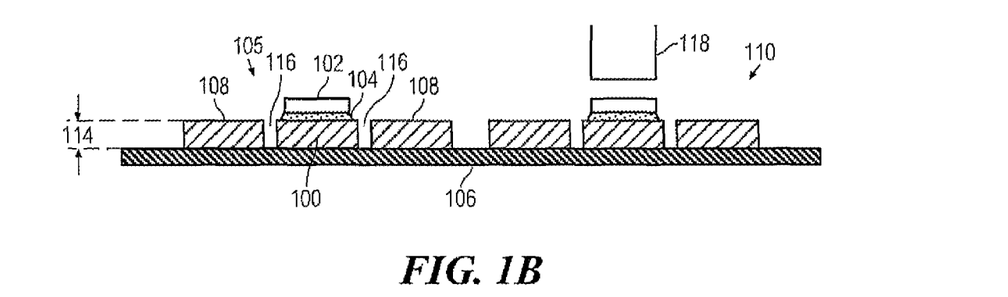
FIG. 1B is an elevational view illustrating formation of a semiconductor device having the die and heat sink assembly of FIG. 1A in accordance with an embodiment of the present invention.

A method of forming a semiconductor device using the die and heat sink assembly 105 is illustrated in FIG. 1B. The semiconductor device also comprises a support element 106 and a base component 108. Thus, in essence, FIG. 1B illustrates a semiconductor package formed using a method comprising affixing a die 102 to a heat sink 100 to form a die and heat sink assembly 105; and disposing the die and heat sink assembly 105 on a support element 106 of the semiconductor device.

To put it another way, FIG. 1B illustrates a semiconductor device comprising a die and heat sink assembly 105 disposed on a support element 106 of the semiconductor device, the die 102 and heat sink 100 having been pre-assembled prior to being disposed on the support element.

In the embodiment of FIG. 1B, base component 108 comprises a lead frame and/or support element 106 comprises a tape on which lead frame 108 is disposed.

This illustrated method is a particularly advantageous method of forming a semiconductor device given that it is necessary only to perform one placing operation for the pre-assembled die and heat sink assembly 105 on the support element 106, rather than having to place the heat sink 100 on the support element, and thereafter affix the die 102 to the heat sink 100 using material 104, described above. As also mentioned above, the conventional techniques can cause significant difficulties concerning handling. For instance, in conventional techniques where the a heat sink is placed on a tape affixed to an underside of a lead frame, followed by fixing of the die, damage to the tape and/or the lead frame may occur. Using the approach of FIG. 1, high temperature die attach material such as solder may be applied without causing damage to support element 106, for instance, solder die attach within a reflow oven.

Also illustrated in the example of FIG. 1B, is/are optional second or further assemblies 110 and associated lead frame components.

In the illustrated embodiment, and referring again to FIG. 1A, it will be seen that heat sink 100 has a first thickness 112. Additionally, and as illustrated in FIG. 1B, base component 108 has a second thickness 114. That is, in this embodiment, the base component 108 has a first thickness 114 and the heat sink 100 has a second thickness 112, the first thickness 114 being less than the second thickness 112. With such an arrangement, the additional thickness for the dissipation of heat from the die 102, such as a power die, may be efficiently dissipated through the increased-thickness heat sink 100 without having to increase the thickness of the base component 108 (e.g. the lead frame), thereby leading to substantial cost savings in reduced material for the thickness of the lead frame 108, and/or provision of more complex lead frames such as dual-gauge lead frames.

Figure 1C:
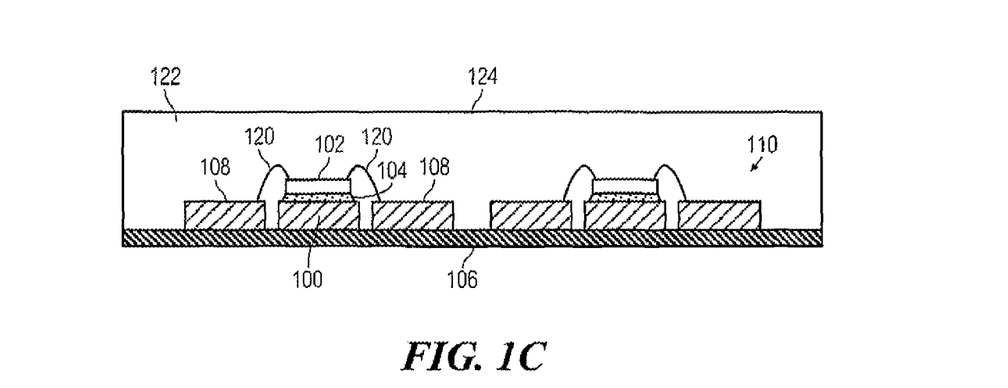
FIG. 1C is an elevational view illustrating the semiconductor device of FIG. 1B complete with bond wires and after a mold encapsulation process step.

In the embodiment of FIG. 1, the die and heat sink assembly 105 is disposed on the support element 106 through an opening 116 of the base component 108. As will be appreciated by those skilled in the art, lead frames typically include an outer frame having one or more openings therethrough, such as opening 116. In the embodiment of FIG. 1, disposing of the die and heat sink assembly 105 on the tape 106 provides a support for the die and heat sink assembly 105, for example holds it in a desired place, for subsequent manufacturing operations, discussed shortly with reference to FIG. 1C.

In the embodiment of FIG. 1, the method may comprise disposing the die and heat sink assembly 105 on the support element (tape) 106, using a pick and place device, one component 118 of which is illustrated in FIG. 1B. Thus, the method lends itself to use with standard semiconductor fabrication tools such as a pick and place devices.

In one or more embodiments, heat sink 100 is a die pad. In such embodiments, FIG. 1 therefore illustrates a semiconductor device formed using a method comprising affixing a die 102 to a die pad 100 to form a die and a die pad assembly 105; and disposing the die and die pad assembly 105 on a support element 106 of the semiconductor device. FIG. 1B illustrates a semiconductor device comprising a die and die pad assembly 105 disposed on a support element 106 of the semiconductor device, wherein the die 102 and die pad 100 have been pre-assembled prior to being disposed on the support element 106. Additionally, in such embodiments, FIG. 1B illustrates a semiconductor device where the base component 108 has a first thickness 114 and the die pad 100 has a second thickness 112, the first thickness 114 being less than the second thickness 112. In such embodiments, the method of forming the semiconductor device comprises disposing the die and a die pad assembly 105 on the support element 106 through an opening 116 of the base component 108.

As mentioned above, one particular benefit of using a tape as the support element 106 is that the tape can hold the die and heat sink assembly 105 in position during subsequent manufacturing steps in the forming of a semiconductor device. As illustrated in FIG. 1C, subsequent to the die and heat sink assembly 105 being disposed on tape 106 through opening 116 of the lead frame 108, bond wires 120 may be formed between die 102 and lead frame 108. Subsequently, mold encapsulation material 122 is used to encapsulate the die and heat sink assembly 105 having been wire bonded to lead frame 108, to form an encapsulated semiconductor device 124. Subsequently, the tape 106 can be removed and the die and heat sink assembly 105 is retained in place by the cured mold encapsulation material.

Figure 2A:
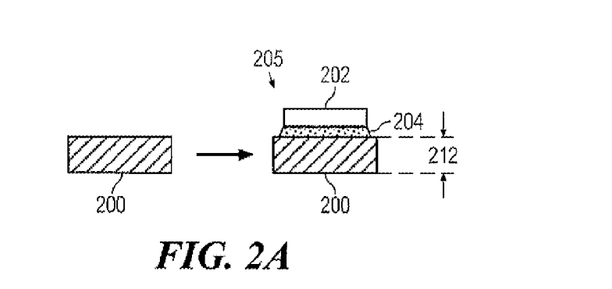
FIG. 2A is an elevational view illustrating the formation of a die and heat sink assembly in accordance with another embodiment of the present invention.

Referring to FIG. 2, an embodiment of the invention in a BGA package context is illustrated. FIG. 2A shows a stand-alone heat sink 200 on which a die 202 is affixed using, for example, solder or thermally-conductive epoxy or film 204. In doing so, a die and heat sink assembly generally referred to by 205 is formed.

Figure 2B:
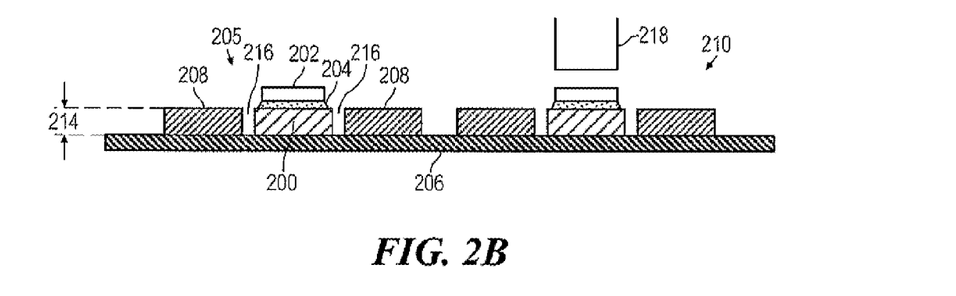
FIG. 2B is an elevational view illustrating formation of a semiconductor device having the die and heat sink assembly of FIG. 2A in accordance with the embodiment of FIG. 2A.

A method of assembling a semiconductor device using the die and heat sink assembly 205 is illustrated in FIG. 2B. The semiconductor device also comprises a support element 206 and a base component 208. In this embodiment, the support element 206 is a tape but the base component 208 is a substrate, such as one would typically find in a BGA semiconductor package. Exemplary suitable substrates include plastic packaging substrates. Thus, in essence, FIG. 2B also illustrates a semiconductor package assembled using a method comprising affixing a die 202 to a heat sink 200 to form a die and heat sink assembly 205; and disposing the die and heat sink assembly 205 on a support element 206 of the semiconductor device. Using this approach, high temperature die attach material may be applied without causing damage to support element 206, for instance, solder die attach within a reflow oven.

Additionally, FIG. 2B illustrates a semiconductor device comprising a die and heat sink assembly 205 disposed on a support element 206 of the semiconductor device, the die 202 and heat sink 200 having been pre-assembled prior to being disposed on the support element. Also illustrated in FIG. 2B is/are optional second or further assemblies 210 and associated substrate components.

In the illustrated embodiment, and referring again to FIG. 2A, it will be seen that heat sink 200 has a first thickness 212 and base component 208 has a second thickness 214. More particularly, the base component 208 has a first thickness 214 and the heat sink 200 has a second thickness 212, where the first thickness 214 is less than the second thickness 212. Again, with such an arrangement, the additional thickness for the dissipation of heat from the die 202, such as a power die, may be efficiently dissipated through the increased-thickness heat sink 200 without having to increase the thickness of the base component 208 (e.g. the packaging substrate), thereby leading to substantial cost savings in reduced material for the thickness of the substrate 206. In an alternative arrangement (not illustrated) the first thickness 214 could be equal to or greater than the second thickness 212. In addition to this, or as a further alternative, the heat sink 200 may comprise of a material which is different than the material of the base component 208 which may be an organic substrate. For instance, copper alloy material may be used as the heat sink, this material being more efficient than substrate material for heat transfer.

Figure 2C:
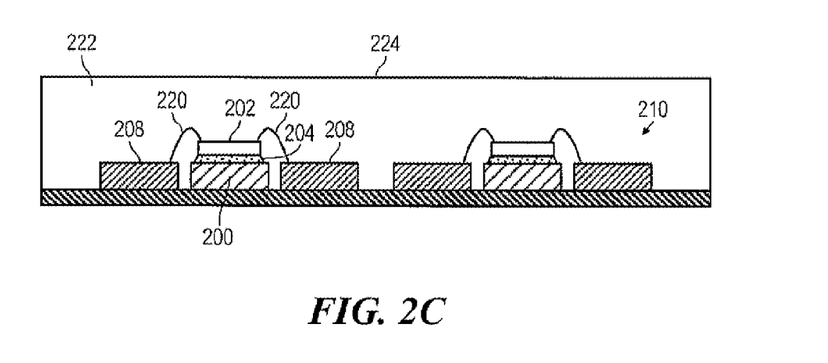
FIG. 2C is an elevational view illustrating the semiconductor device of FIG. 2B complete with bond wires and after a mold encapsulation process step.

In the embodiment of FIG. 2, the die and heat sink assembly 205 is disposed on the support element 206 through an opening 216 of the base component 208. As will be appreciated by those skilled in the art, packaging substrates 206 may be provided with openings therethrough, such as opening 216, or cavities therein. In the embodiment of FIG. 2, disposing of the die and heat sink assembly 205 on the tape 206 provides a support for the die and heat sink assembly 205 for the subsequent operations, discussed shortly with reference to FIG. 2C.

In the embodiment of FIG. 2, the method may also comprise disposing the die and heat sink assembly 205 on the support element (tape) 206, using a pick and place device, one component 218 of which is illustrated in FIG. 2B. Thus, the method of FIG. 2 lends itself to use with standard semiconductor fabrication tools such as a pick and place devices.

In one or more embodiments, the heat sink 200 is a die pad. In such circumstances, FIG. 2 therefore illustrates a semiconductor device assembled by affixing a die 202 to a die pad 200 to form a die and a die pad assembly 205; and disposing the die and die pad assembly 205 on a support element 206 of the semiconductor device. Also, FIG. 2B illustrates a semiconductor device comprising a die and die pad assembly 205 disposed on a support element 206 of the semiconductor device, wherein the die 202 and die pad 200 have been pre-assembled prior to being disposed on the support element 206.

As noted above, one particular benefit of using a tape as the support element 206 is that the tape can hold the die and heat sink assembly 205 in position during subsequent manufacturing steps in the forming of a semiconductor device. As illustrated in FIG. 2C, subsequent to the die and heat sink assembly 205 being disposed on tape 206 through an opening 216 of the substrate 208, bond wires 220 may be connected between die 202 and substrate 208. Subsequently, mold encapsulation material 222 is used to encapsulate the die and heat sink assembly 205 having been wire bonded to lead frame 208, to form an encapsulated semiconductor device 224. The tape may be removed afterwards and the die and heat sink assembly is retained in place by the cured mold encapsulation material.

Figure 3:
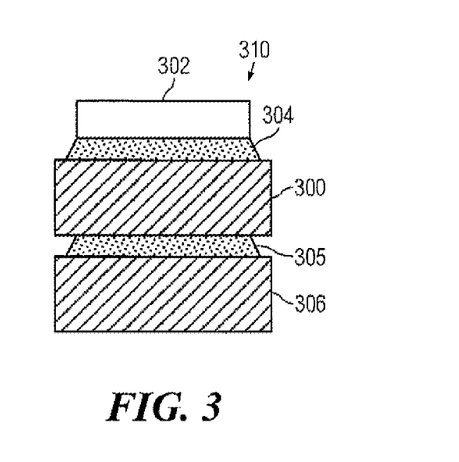
FIG. 3 is an elevational view illustrating a semiconductor device in accordance with a further embodiment of the present invention.

The invention has broader application than the embodiments of FIG. 1 and FIG. 2. For instance, the invention can also be used in other types of packages requiring a heat sink. Another embodiment of the invention is illustrated in FIG. 3. Heat sink 300 has a die 302 affixed thereto such as by soldering or, say, using a thermally-conductive epoxy or film 304, or similar. In this embodiment, the pre-assembled die 302 and heat sink 300 are disposed on a second die pad, which functions as the support element 306, also using solder 305 or the like to affix heat sink 300 to die pad 306. Thus, FIG. 3 also illustrates a semiconductor device comprising a die and heat sink assembly 302, 300 disposed on a support element 306 of the semiconductor device, the die 302 and heat sink 300 having been pre-assembled prior to being disposed on the support element 306, thereby forming semiconductor device 310. In one or more embodiments, heat sink 300 comprises a first die pad, meaning that the support element 306 is a second die pad.

Although the embodiment of FIG. 3 shows heat sink 300 and support element 306 being of comparable size, this is not to be construed as limiting and, of course, the support element 306, which, as noted above, may comprise of a die pad, may be of differing dimensions to the (first) die pad/heat sink 300. Thus, this approach is particularly advantageous in that it offers flexibility in manufacturing for the mixing of pad material, size, thickness, shape and so on.

Turning now to FIG. 4, there are illustrated examples of pre-assembled die and heat sink assemblies disposed on a lead frame.

Figure 4A:
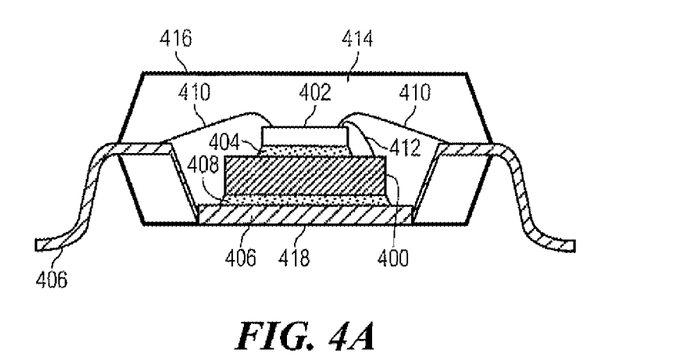
FIG. 4A is an elevational view illustrating a semiconductor device in accordance with yet another embodiment of the present invention.

Taking first FIG. 4A, a heat sink 400 has a die 402 affixed thereto with solder 404 or the like such as thermally-conductive epoxy or film. The heat sink 400 is, in turn, disposed upon a lead frame 406, which acts as the support element. The heat sink 400 is affixed to the lead frame 406 with solder 408 or similar such as thermally-conductive epoxy or film. Bond wires 410 are used for electrical connections between the die 402 and lead frame 406. One or more down bond wires 412 are used to bond the die 402 to the heat sink 400. Encapsulation material 414 encapsulates the die 402 and heat sink 400 assembly to form a semiconductor device 416. In the embodiment of FIG. 4A, an underside 418 of lead frame 406 is exposed on an underside of the semiconductor device 416, which may improve the heat dissipative performance of the semiconductor device 416.

Figure 4B:
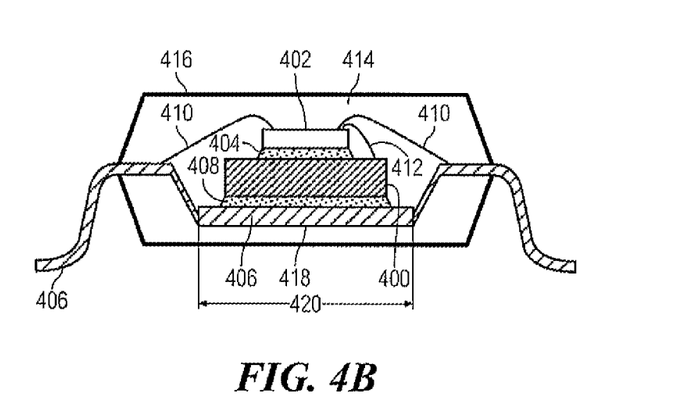
FIG. 4B is an elevational view illustrating a semiconductor device in accordance with a yet further embodiment of the present invention.

A similar arrangement is shown in FIG. 4B. Again, heat sink 400 has a die 402 affixed thereto with solder 404 or the like. The heat sink 400 is, in turn, disposed upon a lead frame 406, which acts as the support element. The heat sink 400 is affixed to the lead frame 406 with solder 408 or the like. Bond wires 410 are used to form electrical connections between the die 402 and the lead frame 406. One or more down bond wires 412 are used to bond the die 402 to the heat sink 400. Encapsulation material 414 encapsulates the die 402 and heat sink 400 assembly to form a semiconductor device 416. In the embodiment of FIG. 4B, an underside 418 of lead frame 406 is not exposed on an underside of the semiconductor device 416, the entire section 420 of lead frame 406 being encapsulated with the encapsulation material 414.

Embodiments of the invention offer improved performance for heat dissipation of the semiconductor devices in comparison to conventional techniques. This is particularly advantageous in embodiments where the die 102, 202, 302, 402 is a power or high-current die. The use of a standalone heat sink on which the die is attached/affixed using soldering or other methods, offers multiple technical advantages as outlined above.

Thus reduced-cost solutions for forming of semiconductor devices in high-thermal applications are provided. For instance, provision of a standalone heat sink on which the die is pre-attached obviates the requirement to build a heat sink into the lead frame or the packaging substrate. This leads to improved flexibility of packaging design and processes for, for example, high-temperature applications.

Embodiments of the invention also allow semiconductor manufacturing processes to meet the requisite performance in high-temperature applications with reduced-cost and good manufacturability.

Other techniques have been implemented in attempts to realize efficient heat dissipation from, say, MAP BGA/LGA semiconductor packages. Conventional packages of this type are typically based on plastic packaging substrates. Heat dissipation occurs mainly by conduction from the integrated circuit die through the substrate and the solder balls to the printed circuit board (PCB). The plastic packaging substrate typically has a very low thermal conductivity, in the region of 0.2 Watts per meter per degree Celsius (W/m/° C.) and is therefore generally poor in both heat conduction and heat spreading. In order to improve the thermal performance, these conventional techniques place a heat spreader inside the semiconductor package.

Figure 5A:
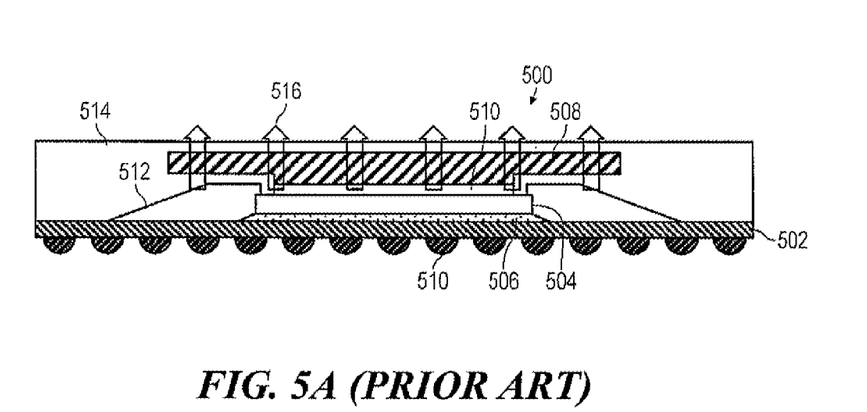
FIG. 5A is an elevational view illustrating a first conventional arrangement for dissipation of heat in a MAP BGA/LGA semiconductor package.

Referring now to FIG. 5A, a first conventional technique for dissipation of heat in a MAP BGA/LGA semiconductor package is illustrated. Thus, in FIG. 5A, a semiconductor package 500 comprises substrate 502 on which die 504 is affixed by, say, solder 506. Heat spreader 508 is, in turn, affixed to a surface of die 504 with, for example, thermally-conductive epoxy or film 510, or the like, such as solder. Solder balls 510 are affixed to an underside of substrate 502. Bond wires 512 form electrical connections between die 504 and substrate 502 and the assembly is encapsulated with encapsulation material 514. Arrows 516 illustrate the heat dissipation by conduction from the die 504 through the heat spreader 508.

Figure 5B:
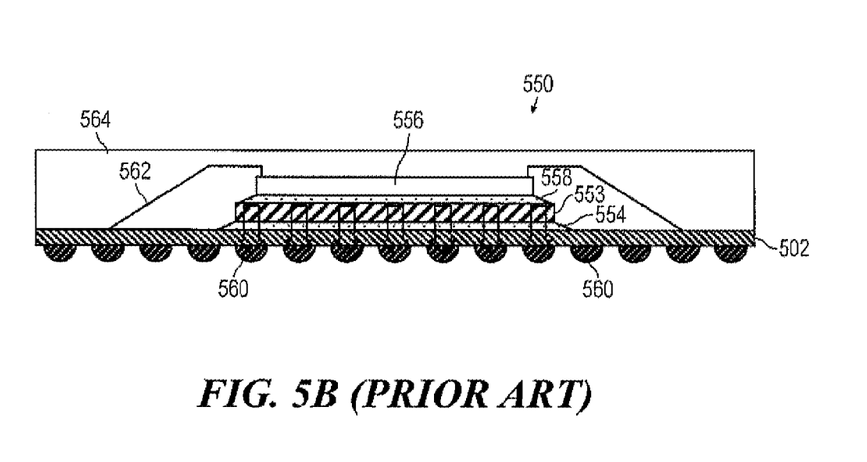
FIG. 5B is an elevational view illustrating a second conventional arrangement for dissipation of heat in a MAP BGA/LGA semiconductor package.

A second conventional technique is illustrated in FIG. 5B, which is somewhat similar technique to that of FIG. 5A. Semiconductor package 550 comprises substrate 552 on which heat spreader 553 is affixed with thermally-conductive epoxy or film 554. A die 556 is affixed to heat spreader 553 with solder 558. Solder balls 560 are affixed to an underside of substrate 552. Bond wires 562 form electrical connections between die 556 and substrate 552 and the assembly is encapsulated with encapsulation material 564. Arrows 566 illustrate the heat dissipation by conduction from the die 556 through heat spreader 553, substrate 552 and solderballs 560.

The method of FIG. 5A, is limited by the low thermal conductivity of the molding compound material 514 (around 0.2~0.3 W/m/° C.) and the method of FIG. 5B is limited by the low thermal conductivity of the BT or FR4 substrate (around 0.2~0.9 W/m/° C.). Thus, it is desirable to have improved thermal capacity for MAP BGA packages and the like. Additionally, it is desirable to develop highly reliable, but with reduced-complexity, manufacturing techniques for MAP BGA packages and the like.

Figure 6:
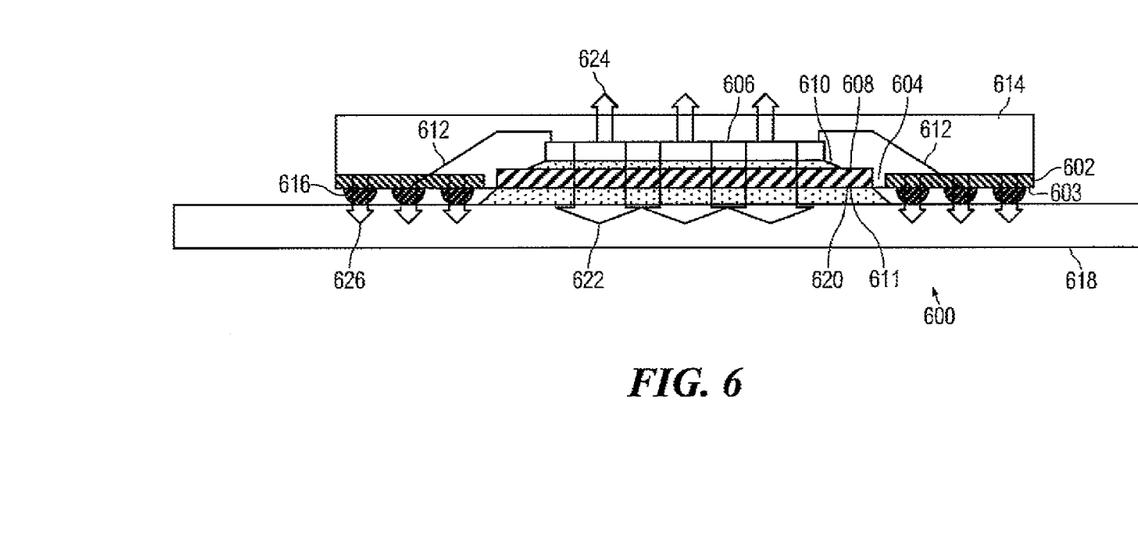
FIG. 6 is an elevational view illustrating a semiconductor device formed with a manufacturing process for improved heat dissipation.

One solution is illustrated in FIG. 6, which illustrates a semiconductor device 600 having a substrate 602 having a tape (not shown) affixed to an underside 603 of substrate 602. Substrate 602 has a hole 604 therethrough. The die 606 is affixed to heat spreader 608 with, for example, thermally-conductive epoxy or film 610, or solder. Bond wires 612 form electrical connections between die 606 and plating traces on substrate 602. Encapsulation material 614 encapsulates the die and heat spreader assembly, after which the tape may be removed. Solderballs 616 are formed on the underside 603 of substrate 602 and are electrically connected to the plating traces on the upper surface of the substrate through vias (not shown) in the substrate 602. The exposed heat spreader surface defines a first major surface at 611 which is solderable and can be directly soldered to PCB 618 with solder 620. Arrows 622 illustrate the conduction of heat from die 606 to the heat spreader 608 through solder 610, and through solder 620 to PCB 618. Arrows 624 indicate dissipation of heat by conduction through encapsulation material 614. Additionally, arrows 626 illustrate dissipation of heat by conduction through solderballs 616 to PCB 618.

Thus, FIG. 6 illustrates a semiconductor device having been formed in a method comprising: providing a base component 602 having an opening 604 therethrough; affixing a tape (not shown) to an underside 603 of the base component 602, the tape covering the opening 604 through the base component 602; placing a heat sink 608 onto the tape, a first major surface 611 of the heat sink 608 being in contact with the tape, the heat sink 608 resting in the opening 604; and affixing a die 606 to a second major surface of the heat sink 608. The tape may be removed prior to attachment of the solder balls and singulation.

In the example of FIG. 6, base component 602 is a packaging substrate, but the techniques have broader application to, for example, QFN processes where the base component 602 is a lead frame.

In the exemplary method of FIG. 6, the first major surface 611 of the heat sink 608 is coplanar with the underside 603 of the base component 602.

The method of forming the semiconductor device of FIG. 6 is illustrated step-by-step with reference to FIG. 7, and in a BGA context. Referring first to FIG. 7A, a substrate 602 having a through window 604 is provided. A smaller-scale plan view of substrate 602 is shown in FIG. 7B illustrating the substrate having multiple through windows 604.

Figure 7A:
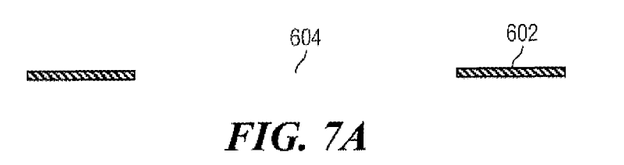
FIG. 7A-FIG. 7O are a series of views illustrating a process for manufacturing the semiconductor device of FIG. 6.
Figure 7B:
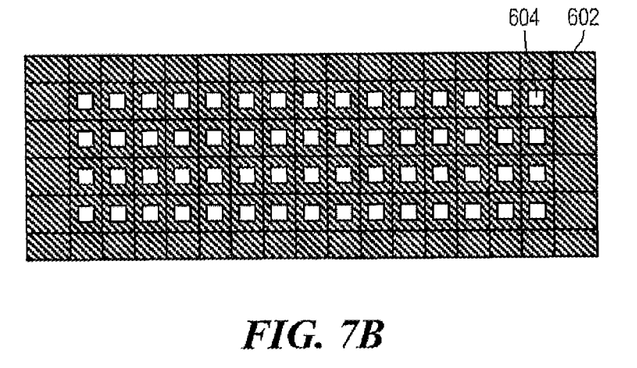
Figure 7C:
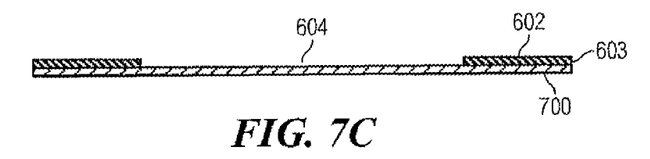
Figure 7D:
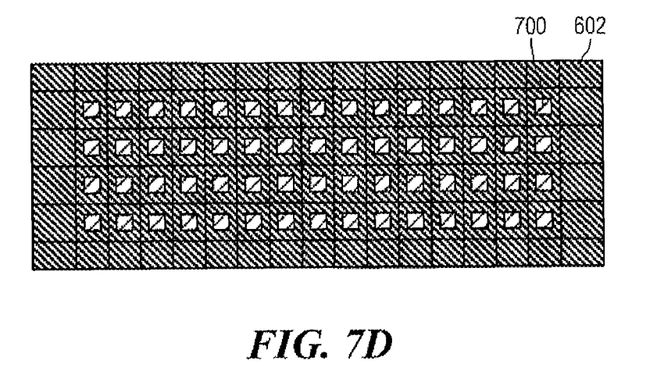

In FIG. 7C, tape 700 is applied to an underside 603 of substrate 602. As illustrated in the smaller-scale plan view of FIG. 7D, tape 700 covers the windows 604 of substrate 602.

Figure 7E:
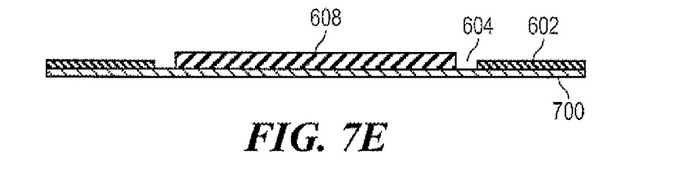
Figure 7F:
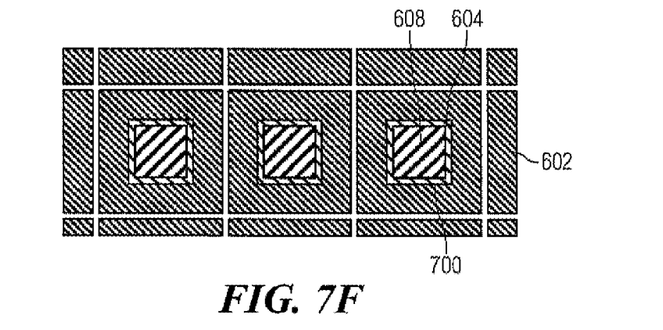

Next, as shown in FIG. 7E, heat spreader 608 is disposed or placed onto tape 700 through window 604 of substrate 602. FIG. 7F illustrates this in part plan view.

Figure 7G:
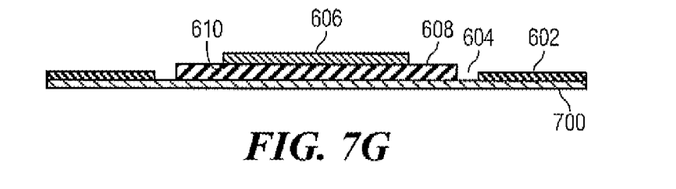
Figure 7H:
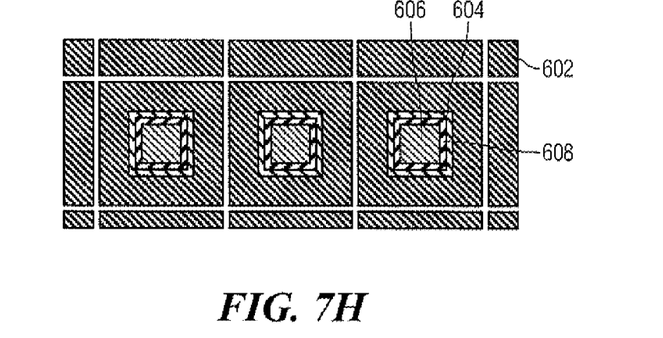

Turning now to FIG. 7G, die 606 is shown attached to heat spreader 608 using, for example, epoxy film 610. FIG. 7H illustrates this in part plan view.

Figure 7I:
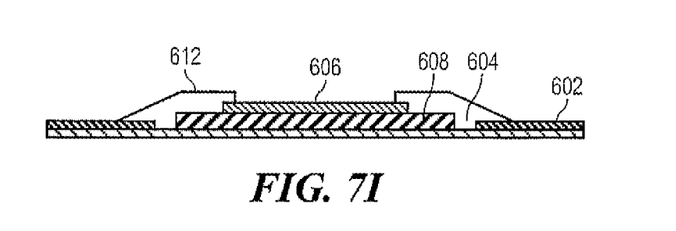
Figure 7J:
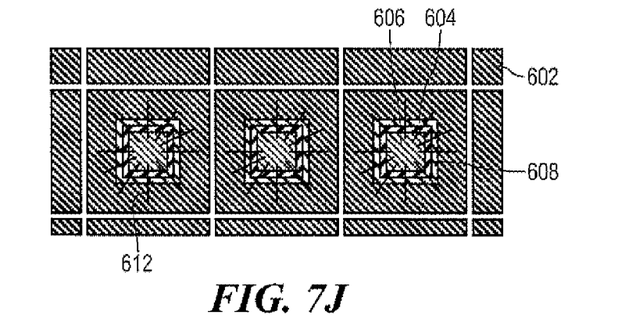

Electrical connections are formed between die 606 and plating traces on substrate 602 using bond wires 612, as illustrated in FIGS. 7I and 7J.

Figure 7K:
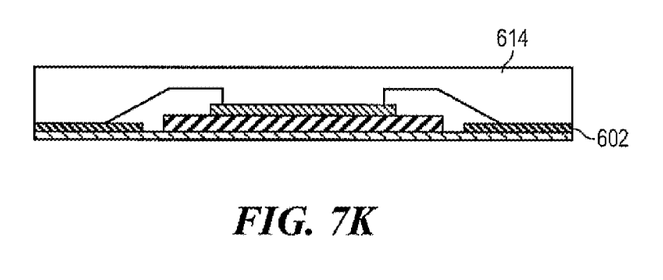

A molding process is then carried out to encapsulate the die and heat sink assembly on the substrate 602 using encapsulation material 614, as illustrated in FIG. 7K, and the encapsulation material is cured.

Figure 7L:
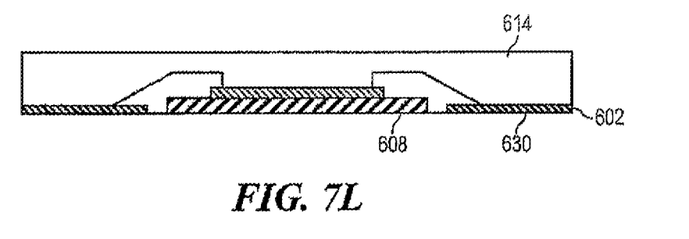
Figure 7M:
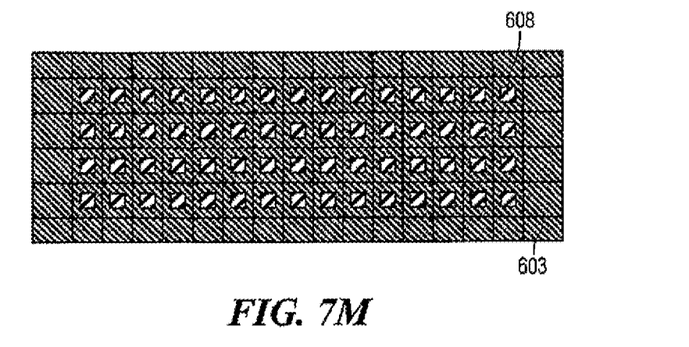

As illustrated in FIG. 7L, tape 700 is removed, thereby exposing the underside 603 of substrate 602 and heat sink 608, now held in place with the cured encapsulation material 614. FIG. 7M illustrates an underside view of substrate 603 with the exposed heat sinks 608.

Figure 7N:
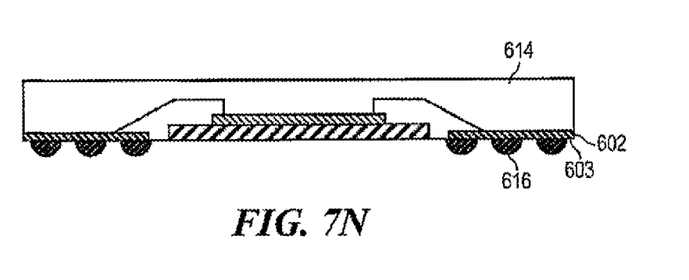
Figure 7O:
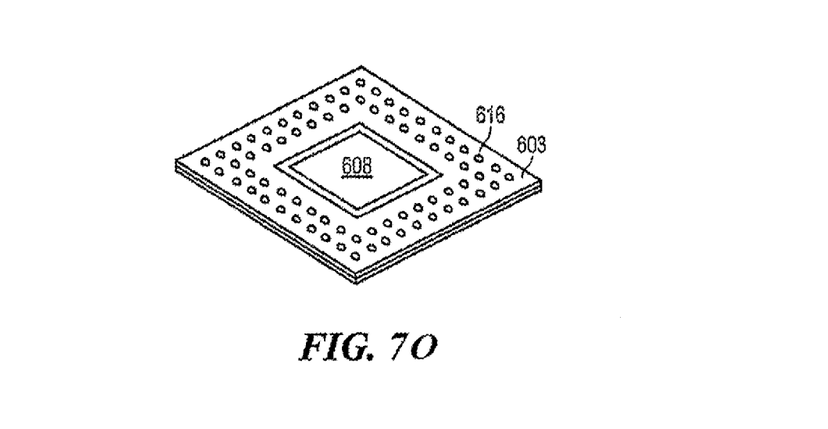

FIG. 7N illustrates the semiconductor package after solderballs 616 have been attached to the underside 603 of substrate 602. An underside of a completed package, after singulation, is illustrated in FIG. 7O in perspective view, where the exposed heat sink 608 can be seen on the underside 603 along with the solderballs 616.

Thus, the illustrated technique provides for a through-window at the substrate centre. An exposed heat spreader at the centre of the BGA side of the substrate can be affixed to a PCB by, for example, soldering. As illustrated, an adhesive tape is used during the process to maintain the heat sink in position prior to encapsulation.

Aside from offering improvements in heat dissipation and improved manufacturability, the illustrated techniques offer the additional significant benefit in that many of the steps of the process are the same, or at least similar, as manufacturing processes used in conventional MAP BGA processes. Additionally, the tool used for the taping process is similar to a QFN taping process tool. Yet further, normal die bond tools or Pick & Place tools can be used for the attachment of the heat sink and/or the die. Moreover, it is anticipated that numerous substrate manufacturers will be able to provide the required substrates having the through-window.

The heat spreader/heat sink can be applied by waffle pack or wafer ring with tape.

The method of forming a semiconductor device illustrated in FIG. 6 can improve the performance of BGA/LGA packages for them to have an equivalent thermal performance when compared to EPAD lead packages such as EPAD QFP, as well as have improved manufacturability and reliability. Additionally, a package formed in accordance with the techniques illustrated in FIG. 6 and FIG. 7, may have increased thermal conductivity, particularly when using a metal heat spreader and solder, of around 400 W/m/° C.

One significant difference between the techniques illustrated in FIG. 6 and the conventional techniques discussed above, is the techniques of FIG. 6 does not require a connection or interface between the substrate 602 and the heat spreader 608. The connection between the substrate and the heat sink in the conventional techniques has been found to be a weak point during reliability tests, a problem obviated using the technique of FIG. 6, where the heat sink is positioned in a hole or window through the substrate.

The through-window substrate of FIG. 6 and taping process make the exposed heat spreader BGA/LGA packages more reliable, with increased flexibility of manufacturing. The semiconductor device of FIG. 6 meets performance requirements in high-temperature applications whilst, at the same time, offering a simplified process and improved manufacturability.

The techniques illustrated also have application in, say, a QFN/PQFN context and allows semiconductor packages formed using BGA/LGA/QFN or other techniques to be designed with multiple heat spreaders, power leads, passives and dies with increased flexibility. In particular, the techniques can be implemented in a QFN/PQFN context where a flat surface is formed by the encapsulation material and/or substrate/lead frame material.

Variants on the techniques of FIG. 6 and FIG. 7 are illustrated in FIG. 8 to FIG. 11.

Figure 8:
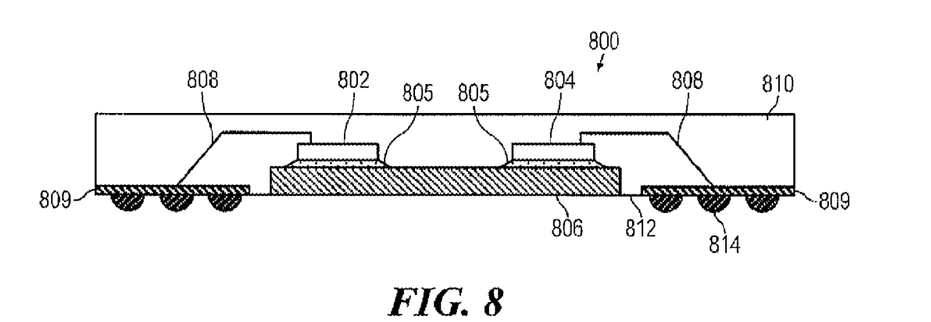
FIG. 8 is an elevational view illustrating a semiconductor device formed using the principles of the manufacturing process of FIG. 7A-FIG. 7O.

Referring to FIG. 8, a semiconductor device 800 comprises first and second dies 802, 804 affixed using die attach material (such as solder or epoxy) 805 to a heat sink/die pad 806. Bond wires 808 are formed between the first and second dies 802, 804 and a substrate 809. Subsequently, mold encapsulation material 810 is used to encapsulate the components of device 800 and, after curing, the encapsulation material 810 solidifies to retain the components in place. An underside 812 of the cured encapsulation material 810 is illustrated. Subsequently, solderballs 814 are attached to an underside of the device 800. Although not illustrated in FIG. 8, a tape is used to retain the dies and the heat sink in place prior to curing of the encapsulation material. The tape is removed prior to attachment of the solderballs 814 to substrate 809.

Figure 9:
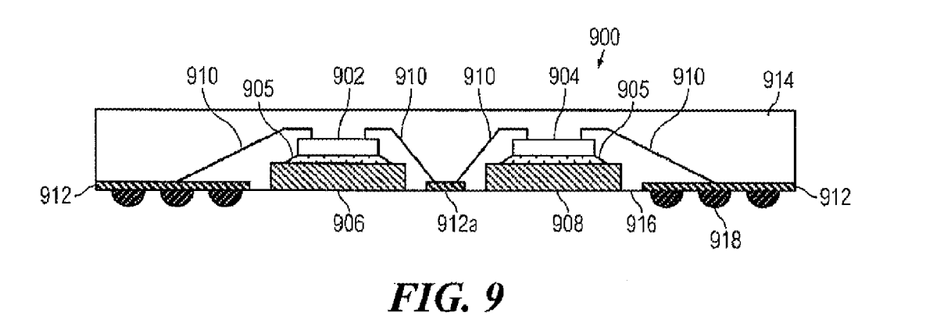
FIG. 9 is an elevational view illustrating a semiconductor device formed using the principles of the manufacturing process of FIG. 7A-FIG. 7O.

As illustrated in FIG. 9, a semiconductor device 900 comprises first and second dies 902, 904 affixed using die attach material 905 to respective first and second heat sink/die pads 906, 908. Bond wires 910 are formed between the first and second dies 902, 904 and substrate 912. In the semiconductor device 900 of FIG. 9, substrate 912 also has an "inner" portion 912A disposed between the first die 906 and the second die 908. Of course, portion 912A may be entirely separate from substrate portions 912. Subsequently, mold encapsulation material 914 is used to encapsulate the components of the device and, after curing, the encapsulation material 914 solidifies to retain the components in place. An underside 916 of the cured encapsulation material 914 is illustrated. Subsequently, solderballs 918 are attached to an underside of the device 900. Although not illustrated in FIG. 9, a tape is used to retain the dies, heat sinks and portion(s) of the substrate in place prior to curing of the encapsulation material. The tape is removed prior to attachment of the solderballs 918 to substrate 912.

Figure 10:
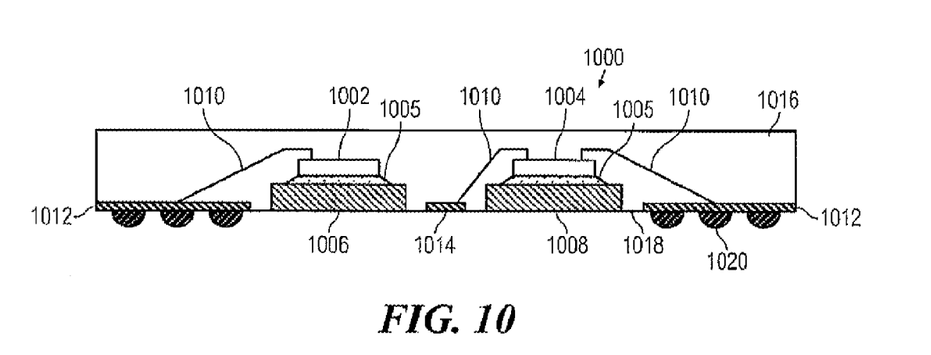
FIG. 10 is an elevational view illustrating a semiconductor device formed using the principles of the manufacturing process of FIG. 7A-FIG. 7O.

A semiconductor device 1000 is illustrated in FIG. 10. Device 1000 comprises first and second dies 1002, 1004 affixed using die attach material 1005 to respective heat sink/die pads 1006, 1008. One or more elements (e.g. metal lead terminals) 1014 are disposed on the tape (not shown). This may be done at the same time as the disposal of the die and heat sink on the tape, or at a different time. Bond wires 1010 are formed between the first and second dies 1002, 1004 and substrate 1012 and the element 1014 respectively. As before, encapsulation material 1016 having an underside 1018 is utilized to encapsulate the components of the device 1000. During the assembly process, the tape (not shown as mentioned above) is used to retain the individual components of the device 1000 in place. After curing of the encapsulation material, the tape is removed and solderballs 1020 are attached to an underside of the substrate 1012.

Figure 11:
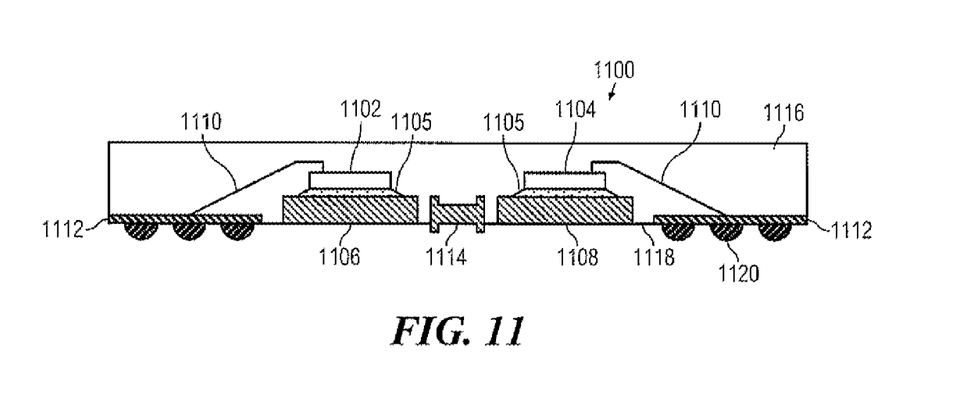
FIG. 11 is an elevational view illustrating a semiconductor device formed using the principles of the manufacturing process of FIG. 7A-FIG. 7O.

Semiconductor device 1100 of FIG. 11 comprises first and second dies 1102, 1104 affixed using die attach material 1105 to respective heat sink/die pads 1106, 1108. The SMDs (Surface Mount Devices) 1114 are disposed on the tape (not shown). This may be done at the same time as the disposal of the die and heat sink on the tape, or at a different time. Bond wires 1110 are formed between the first and second dies 1102, 1104 and substrate 1112. As noted above, semiconductor device 1100 also comprises one or more SMDs 1114. As before, encapsulation material 1116 having an underside 1118 is utilized to encapsulate the components of the device 1100. During the assembly process, a tape (not shown) is used to retain the individual components of the device 1100 in place. After curing of the encapsulation material, the tape is removed and solderballs 1120 attached to an underside of the substrate 1112.

Semiconductor device 1200 (FIG. 12) comprises first and second dies 1202, 1204 affixed using die attach material 1205 to respective heat sink/die pads 1206, 1208. Bond wires 1210 are formed between first and second dies 1202, 1204 and placed lead terminals 1212. The encapsulation material 1214 encapsulates the components of device 1200 and, after curing, retains the components in place. Underside 1216 of encapsulation material 1214 is illustrated.

Figure 12:
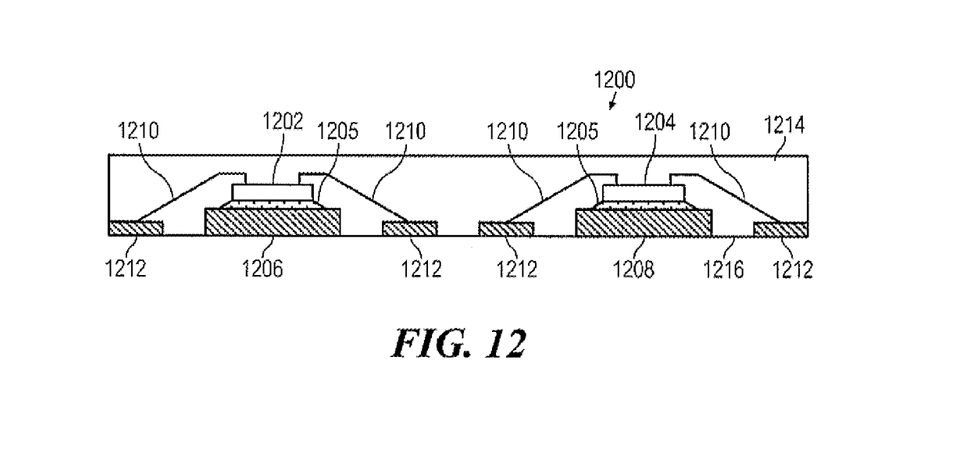
FIG. 12 is an elevational view illustrating a semiconductor device formed using the principles of the manufacturing process of FIG. 7A-FIG. 7O.

Therefore, as illustrated in FIGS. 10 to 12, semiconductor packaging elements (including but not limited to lead terminals and surface mount devices) are placed onto a support element of the semiconductor device—such as a tape used in the assembly process—with our without wires connected between the die and the thus placed packaging elements. The placed elements are encapsulated together with die.

By now it should be appreciated that there has been provided a novel method of forming a semiconductor device having a pre-assembled die and heat sink assembly disposed therein. This offers significant technical advantages, as noted above. Also disclosed, is a novel method of forming a semiconductor device by placing a heat sink onto a tape through a through-hole of a base component of the semiconductor device, such as a substrate or lead frame, and affixing a die to the heat sink. Again, this offers significant technical advantages, also noted above.

Although the invention is described herein with reference to specific embodiments, various modifications and changes can be made without departing from the scope of the present invention as set forth in the claims below. For example, more than one die and heat sink assembly may be used. The base component may be a substrate or a lead frame, or other suitable base component. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

What is claimed is:

1. A method of forming a semiconductor device, the method comprising:
   affixing a die to a heat sink to form a die and heat sink assembly, wherein the die is affixed to the heat sink with a high temperature die attach material; and
   disposing the die and heat sink assembly on a support element of the semiconductor device, wherein the die and heat sink assembly is pre-assembled before being disposed on the support element, and
   wherein the support element comprises a tape on which a base component of the semiconductor device is disposed.

2. The method of claim 1, wherein the base component is a lead frame.

3. The method of claim 1, wherein the base component is a substrate.

4. The method of claim 1, wherein the base component has a first thickness and the heat sink has a second thickness, the first thickness being less than the second thickness.

5. The method of claim 1, further comprising disposing the die and heat sink assembly on the support element through an opening of the base component.

6. The method of claim 1, further comprising disposing the die and heat sink assembly on the support element using a pick and place device.

7. A method of forming a semiconductor device, the method comprising:
   affixing a die to a heat sink to form a die and heat sink assembly, wherein the die is affixed to the heat sink with a high temperature die attach material; and
   disposing the die and heat sink assembly on a lead frame of the semiconductor device, wherein the die and heat sink assembly is pre-assembled before being disposed on the lead frame.

8. A method of forming a semiconductor device, the method comprising:
   affixing a die to a die pad to form a die and die pad assembly with a high temperature die attach material; and
   disposing the die and die pad assembly on a support element of the semiconductor device, wherein the die and die pad assembly is pre-assembled before being disposed on the support element, and
   wherein the support element is a tape on which a base component of the semiconductor device is disposed.

9. The method of claim 8, wherein the base component is a lead frame.

10. The method of claim 8, wherein the base component is a substrate.

11. The method of claim 8, wherein the base component has a first thickness and the die pad has a second thickness, the first thickness being less than the second thickness.

12. The method of claim 8, further comprising disposing the die and die pad assembly on the support element through an opening of the base component.

13. The method of claim 8, further comprising disposing the die and die pad assembly on the support element using a pick and place device.

14. The method of claim 8, wherein the support element is a second die pad.

15. The method of claim 8, wherein the high temperature die attach material is one of solder and high temperature cured epoxy.

* * * * *